(12) United States Patent  
Sato

(10) Patent No.: US 6,735,059 B2  
(45) Date of Patent: May 11, 2004

(54) MAGNETORESISTIVE EFFECTIVE TYPE ELEMENT, THIN FILM MAGNETIC HEAD, MAGNETIC HEAD DEVICE AND MAGNETIC DISK DRIVING DEVICE WHICH USE SAID MAGNETORESISTIVE EFFECTIVE TYPE ELEMENT WHICH INCLUDES AT LEAST THREE SHIELDING FILMS

(75) Inventor: Junichi Sato, Chuo-ku (JP)

(73) Assignee: TDK Corporation, Tokyo (JP)

( * ) Notice: Subject to any disclaimer, the term of this patent is extended or adjusted under 35 U.S.C. 154(b) by 161 days.

(21) Appl. No.: 10/119,155

(22) Filed: Apr. 10, 2002

(65) Prior Publication Data

US 2002/0149887 A1 Oct. 17, 2002

(30) Foreign Application Priority Data

Apr. 13, 2001 (JP) ........................................ 2001-115657

(51) Int. Cl.⁷ .................................................. G11B 5/39
(52) U.S. Cl. ........................................ 360/319; 360/322
(58) Field of Search ................................. 360/313–328

(56) References Cited

U.S. PATENT DOCUMENTS 5,668,688 A     9/1997  Dykes et al.
6,084,752 A     7/2000  Sakakima et al.
6,493,195 B1 * 12/2002  Hayashi et al. ............. 360/322

* cited by examiner

Primary Examiner—A. J. Heinz
(74) Attorney, Agent, or Firm—Oliff & Berridge, PLC

(57) ABSTRACT

A magnetoresistive effective type element, comprising: a magnetoresistive effective film; a first shielding film of which one main surface is adjacent to one main surface of said magnetoresistive effective film; a second shielding film of which one main surface is adjacent to the other main surface of said magnetoresistive effective film; and a third shielding film of which one main surface is adjacent to the other main surface of said first shielding film or said second shielding film opposite to said magnetoresistive effective film, wherein said first shielding film and said second shielding film function as current-supplying layers to flow current perpendicular to and through said magnetoresistive effective film, and wherein said first shielding film and said second shielding film are made of at least one selected from the group consisting of NiFe, CoZrTa, FeN, FeAlSi, NiFe alloy, Co-based amorphous material and Fe-based soft magnetic material.

35 Claims, 7 Drawing Sheets

MAGNETORESISTIVE EFFECTIVE TYPE ELEMENT, THIN FILM MAGNETIC HEAD, MAGNETIC HEAD DEVICE AND MAGNETIC DISK DRIVING DEVICE WHICH USE SAID MAGNETORESISTIVE EFFECTIVE TYPE ELEMENT WHICH INCLUDES AT LEAST THREE SHIELDING FILMS

BACKGROUND OF THE INVENTION

1. Field of the Invention

This invention relates to a magnetoresistive effective type element, particularly usable as a reading element of a thin film magnetic head, and the thin film magnetic head, a magnetic head device and a magnetic disk driving device which use the magnetoresistive effective type element.

2. Related Art Statement

A given information is stored in a magnetic recording medium by utilizing the direction of magnetization thereof. Then, with the recent advance of high recording density for the magnetic recording medium, such an attempt is made as to narrow the track width of the recording medium and thus, develop the longitudinal recording density thereof. Therefore, it is desired that a high sensitivity sensor to read the information precisely from the magnetic recording medium is developed. As such a sensor, recently, a thin film magnetic head including a giant magnetoresistive effective type element is utilized.

As the magnetoresistive effective type element, conventionally, a current in plane (CIP) type element was employed. According to the CIP type element, the change in sense current flown through the magnetoresistive effective film of the element itself is detected and thus, a given information stored in a magnetic recording medium is read out.

On the other hand, with the develop of longitudinal recording density by the narrowing of track width, as mentioned above, a current perpendicular to plane (CPP) type element has been employed. According to the CPP type element, the change in sense current flown perpendicular to the magnetoresistive effective film of the element itself is detected and thus, a given information stored in a magnetic recording medium is read out.

A method for flowing a current perpendicular to a magnetoresistive effective film is disclosed in National Publication of the Japanese-translated version No. 11-509956 where leading films are provided so as to sandwich the magnetoresistive effective film and the current is flown in the direction perpendicular to the magnetoresistive effective film via the leading films.

In the above method, however, it is required that shielding films are provided outside the leading films, respectively, and gap films made of insulating material are provided between the shielding films and the leading films, respectively, in order to separate the shielding film and the leading films electrically. In this case, the reading width for a magnetic recording medium depends on the distance between the shielding films, and thus, the reading width is increased and the precise reproduction of a given information stored in the recording medium can not be performed.

In this point of view, such a technique is disclosed in U.S. Pat. No. 6,084,752 as doubling shielding films of a magnetoresistive effective element as leading films thereof, and flowing a current perpendicular to the magnetoresistive effective type film via the leading films. In this case, since it is not required that other leading film are provided, in addition to the shielding films, the reading width defined by the distance between the shielding films can be reduced. However, an external noise is superimposed on a given reproduction information from the magnetic recording medium, and as a result, the magnetoresistive effective type element and thus, the thin film magnetic head results in generating larger noises.

SUMMARY OF THE INVENTION

It is an object of the present invention to provide a new CPP type magnetoresistive effective type element which can reproduce a given information stored in a magnetic recording medium at a higher S/N ratio almost without external noise.

For achieving the above objects, this invention relates to a magnetoresistive effective type element, including:

a magnetoresistive effective film, a first shielding film of which one main surface is adjacent to one main surface of the magnetoresistive effective film, a second shielding film of which one main surface is adjacent to the other main surface of the magnetoresistive effective film, and a third shielding film of which one main surface is adjacent to the other main surface of the first shielding film or the second shielding film opposite to the magnetoresistive effective film and which is provided via an electrical high resistivity member, the first shielding film and the second shielding film functioning as current-supplying layers to flow current perpendicular to and through the magnetoresistive effective film.

The inventors have intensely studied to achieve the above object. Then, they have investigated variously, in order to find out the cause of the external noise in the magnetoresistive effective type element disclosed in U.S. Pat. No. 6,084,752.

As a result, they found out that the external noise results from an external noise on a reproduction wave from the shielding films doubling as the leading films. That is, since the shielding films functions as an antenna and also, doubles as the leading films, an external noise is easily superimposed on the reproduction wave from the shielding films.

According to the present invention, since another shielding film is provided outside a shielding film doubling as a leading film via an electrical high resistivity member, the shielding effect can be maintained sufficiently for an external noise.

According to the present invention, therefore, since the reading width is determined on the distance between the first shielding film and the second shielding film which double as leading films and are provided so as to be adjacent to the magnetoresistive effective film, the reading width can be narrowed. Moreover, the third shielding film and the fourth shielding film enable a sufficient shielding effect to be imparted to the magnetoresistive effective type element of the present invention.

BRIEF DESCRIPTION OF THE DRAWINGS

For a better understanding of this invention, reference is made to the attached drawings, wherein.

DETAILED DESCRIPTION OF PREFERRED EMBODIMENTS

Figure 1:
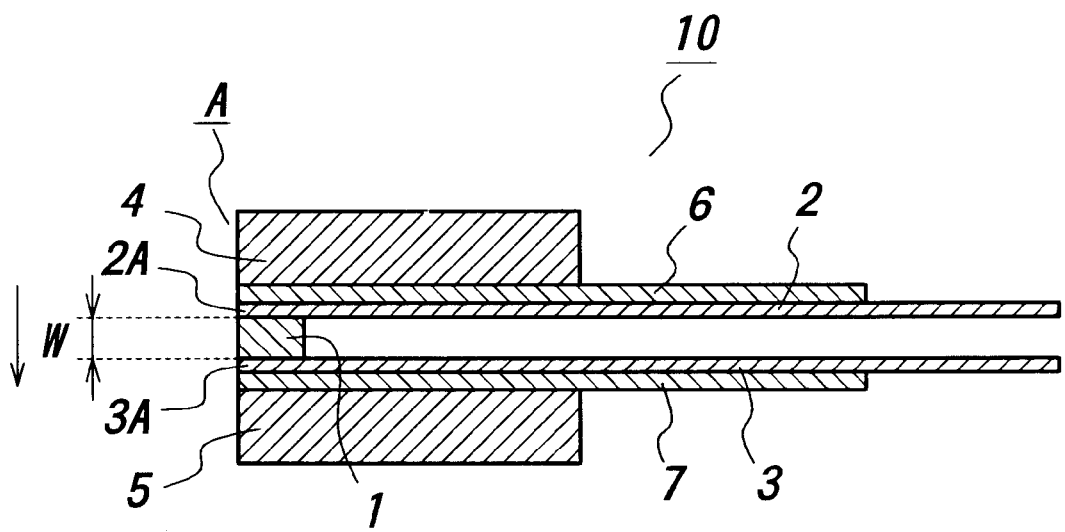
FIG. 1 is a cross sectional view schematically showing a magnetoresistive effective type element according to the present invention.
Figure 2:
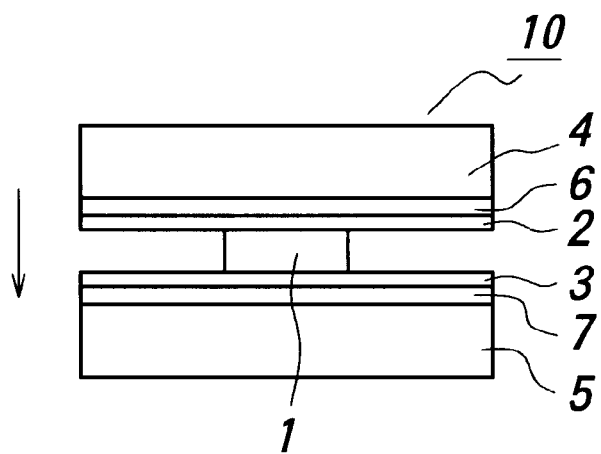
FIG. 2 is an elevational view of the magnetoresistive effective type element shown in FIG. 1.

The present invention will be described in detail hereinafter, with reference to the accompanying views. FIG. 1 is a cross sectional view schematically showing a magnetoresistive effective type element according to the present invention, and FIG. 2 is an elevational view of the magnetoresistive effective type element shown in FIG. 1. For clarifying the characteristics of the present invention, only essential components relating to the present invention are depicted in FIGS. 1 and 2.

A magnetoresistive effective type element 10 depicted in FIGS. 1 and 2 includes a first top shielding film 2 and a first bottom shielding film 3 which sandwich a magnetoresistive effective film 1. Then, the magnetoresistive effective type element 10 includes a second top shielding film 4 above the first top shielding film 2 via a gap film 6 and a second bottom shielding film 5 below the first bottom shielding film 3 via a gap film 7.

The first top shielding film 2 and the first bottom shielding film 3 function as shielding layers, and also function as current supplying layers, that is, leading films for the magnetoresistive effective film 1 due to the electrical conduction thereof, according to the present invention. For example, the current is flown in the thickness direction of the magnetoresistive effective film 1 which is designated by the arrow in FIG. 1.

In the magnetoresistive effective type element 10 shown in FIGS. 1 and 2, since the practical reading gap width is defined by the distance W between the first top shielding film 2 and the second bottom shielding film 3, that is, the distance W between the opposite surfaces of the first top shielding film 2 and the second bottom shielding film 3, the reading gap width can be reduced. Therefore, reproduction for high density recording medium can be performed sufficiently. Also, sufficient shielding effect can be imparted to the magnetoresistive effective type element 10 entirely by the second top shielding film 4 and the second bottom shielding film 5.

As mentioned above, the magnetoresistive effective type element 10 depicted in FIGS. 1 and 2 includes the gap films 6 and 7 between the first top shielding film 2 and the second top shielding film 4 and between the first bottom shielding film 3 and the second bottom shielding film 5, respectively. Therefore, the top shielding films and the bottom shielding films can be electrically insulated from one another.

The magnetoresistive effective type film 1 may be composed of a TMR element made of bottom ferromagnetic layer (free layer)/tunnel barrier layer/top ferromagnetic layer (pinned layer)/anti-ferromagnetic layer stacking structure, or a spin valve film structure-type GMR element made of bottom ferromagnetic layer (free layer)/non-magnetic metallic layer/top ferromagnetic layer (pinned layer)/anti-ferromagnetic layer stacking structure.

In this case, the free layer and the pinned layer may be made of ferromagnetic material such as Fe, Co, Ni, FeCo, NiFe, CoZrNb, FeCoNi. The tunnel barrier layer and the non-magnetic metallic layer may be made of $Al_2O_3$, NiO, GdO, MgO, $Ta_2O_5$, $MoO_2$, $TiO_2$, $WO_2$. The anti-ferromagnetic layer may be made of PtMn or RuRhMn.

The thickness of the free layer is preferably set within 1–10 nm, particularly, within 2–5 nm. If the thickness of the free layer is set too thick, the output power level may be lowered at the operation of a thin film magnetic head including the magnetoresistive effective type element 10, and fluctuated remarkably due to Barkhausen noise. If the thickness of the free layer is set too thin, the output power level may be also lowered due to the deterioration of the TMR effect.

The thickness of the pinned layer is preferably set within 1–10 nm, particularly within 2–5 nm. If the thickness of the pinned layer is set too thick, the exchange binding biasing magnetization for the anti-ferromagnetic layer is lowered, and if the thickness of the pinned layer is set too thin, the TMR change ratio is lowered. Also, the thicknesses of the tunnel barrier layer and the nonmagnetic metallic layer are preferably set within 0.5–2 nm. In view of the low resistivity of the magnetoresistive effective type element 10, it is desired that the thicknesses of the tunnel barrier layer and the non-magnetic metallic layer is set as thin as possible. However, if the thicknesses are set too thin, pinholes may be created in the tunnel barrier layer and the non-magnetic metallic layer, and thus, leak currents may be flown therein. Moreover, the thickness of the anti-ferromagnetic layer is preferably set within 6–30 nm.

The gap films 6 and 7 is made of metal oxide such as TaO and NiO, high resistive material such as semiconductor material, or insulating material such as $Al_2O_3$ and $SiO_2$.

It is desired that the first top shielding film 2 and the first bottom shielding film 3 are made of at least one soft magnetic material selected from the group consisting of NiFe, CoZrTa, FeN, FeAlSi, NiFe alloy, Co-based amorphous material and Fe-based amorphous material. Since such a soft magnetic material has high tramsmittivity and high electrical conductivity, good shielding effect can be imparted to the first top shielding film 2 and the first bottom shielding film 3, and the loss in current flown perpendicular to and through the magnetoresistive effective film 1 can be reduced. Therefore, the S/N ratio of the magnetoresistive effective type element 1 can be enhanced.

The first top shielding film 2 and the first bottom shielding film 3 may be made of a stacking structure of a soft magnetic layer and a conductive layer. The soft magnetic layer may be made of a soft magnetic material as mentioned above. The conductive layer may be made of at least one conductive material selected from the group consisting of Ti, Cr, Rh, Al, Ta, Au, Ag, Cu and alloy thereof. In this case, the electrical conductivities of the first top shielding film 2 and the first bottom shielding film 3 can be enhanced, and thus, the current loss for the magnetoresistive effective film 1 can be reduced. For more enhancing the reduction in current loss, it is desired that the conductive layer is formed so as to contact with the magnetoresistive effective film 1. If the lower layer of the shielding film 2 and/or 3 is composed of the conductive film, and the upper layer thereof is composed of the soft magnetic layer, the magnetic property of the shielding film 2 and/or 3 can be developed.

On the other hand, the second top shielding film 4 and the second bottom shielding film 5 are made of at least one selected from the group consisting of NiFe, CoZrTa, FeN, FeAlSi, NiFe alloy, Co-based amorphous material and Fe-based soft magnetic material. In this case, sufficient shielding effect can be imparted to the magnetoresistive effective type element 10 entirely.

The thicknesses of the second top shielding film 4 and the second bottom shielding film 5 are preferably set within 1000–3000 nm, particularly within 1500–2000 nm. In this case, irrespective of the materials and the layered structures of the first top shielding film 2 and the first bottom shielding film 3, sufficient shielding effect can be imparted to the magnetoresistive effective type element 10.

In the above case where the thicknesses of the second top shielding film 4 and the second bottom shielding film 5 are set within the above range, the thicknesses of the first top shielding film 2 and the first bottom shielding film 3 can be set to 500 nm or below. In this case, rubbing noise superimposed on the shielding films 2 and 3 can be reduced, and as a result, total noise on the magnetoresistive effective type element 10 can be also reduced.

Figure 3:
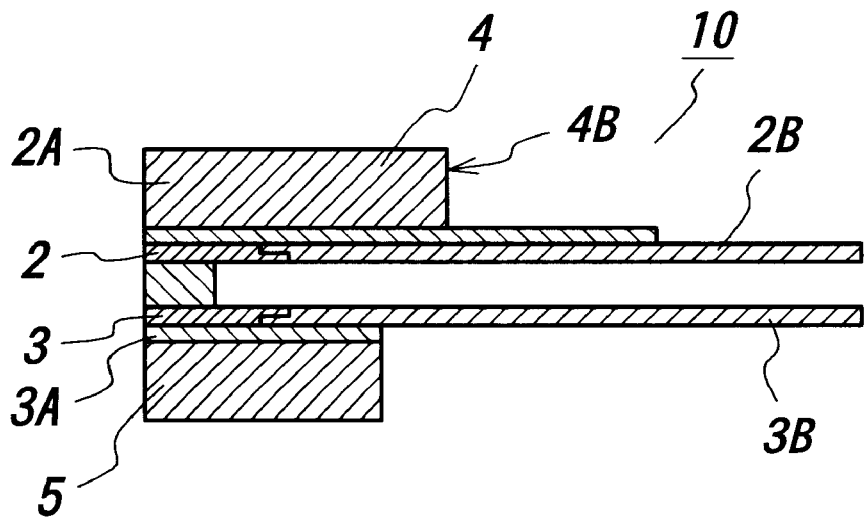
FIG. 3 is a cross sectional view schematically showing another magnetoresistive effective type element which is modified for the one shown in FIGS. 1 and 2.

FIG. 3 is a cross sectional view schematically showing another magnetoresistive effective type element which is modified for the one shown in FIGS. 1 and 2. In FIG. 3, the same reference numerals are given to the similar components to the ones shown in FIGS. 1 and 2. In the magnetoresistive effective type element 10 shown in FIG. 3, conductive films 2B and 3B made of a conductive material as mentioned above are provided at the opposite sides of the ends 2A and 3A of the first top shielding film 2 and the first bottom shielding film 3 which are positioned at the backwards thereof so that the films 2B and 3B continue from the shielding films 2 and 3. In this case, the loss in current perpendicular to and through the magnetoresistive effective film 1 can be reduced effectively, and thus, the S/N ratio of the magnetoresistive effective type element 10 can be enhanced.

Figure 4:
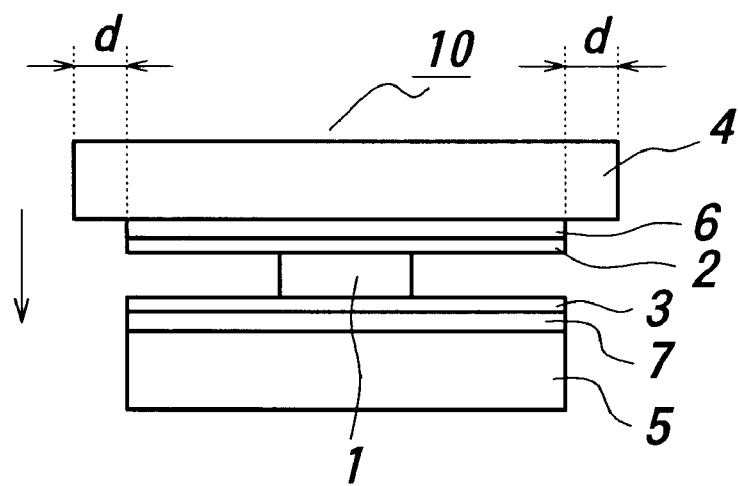
FIG. 4 is an elevational view schematically showing still another magnetoresistive effective type element which is also modified for the one shown in FIGS. 1 and 2.

FIG. 4 is an elevational view schematically showing still another magnetoresistive effective type element which is also modified for the one shown in FIGS. 1 and 2. In FIG. 4, the same reference numerals are given to the similar components to the ones shown in FIGS. 1 and 2.

In the magnetoresistive effective type element 10 depicted in FIG. 4, the areas of the main surfaces of the second top shielding film 4 is set lager than the ones of the main surfaces of the first top shielding film 2 and the first bottom shielding film 3. Also, the end portions 4B of the second top shielding film 4 are projected from the peripheries of the first top shielding film 2 and the first bottom shielding film 3, and thus, the shielding films 2 and 3 are covered with he second top shielding film 4. In this case, larger shielding effect can be imparted to the magnetoresistive effective type element 10, and external noise to be superimposed can be reduced more effectively. Concretely, the projecting degree of the second top shielding film 4 is set to 5 nm or over.

The second top shielding film 4 may be also made in a thickness within 1000–3000 nm of at least one selected from the group consisting of NiFe, CoZrTa, FeN, FeAlSi, NiFe alloy, Co-based amorphous material and Fe-based soft magnetic material.

The magnetoresistive effective type element of the present invention as mentioned above may be employed only for a reading element, and combined with an inductive type writing element, to fabricate a composite type thin film magnetic head.

Figure 5:
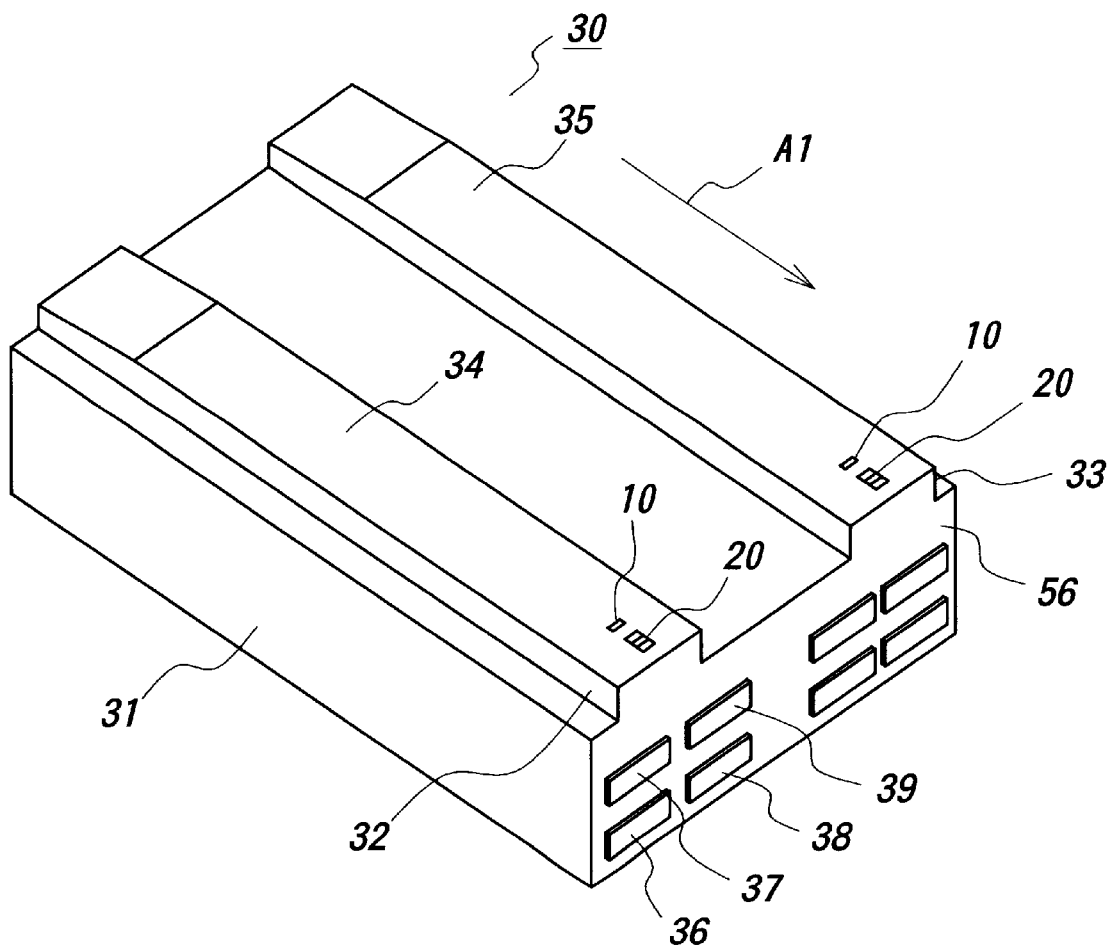
FIG. 5 is a perspective view showing a thin film magnetic head for longitudinal magnetic recording which uses a magnetoresistive effective type element according to the present invention.
Figure 6:
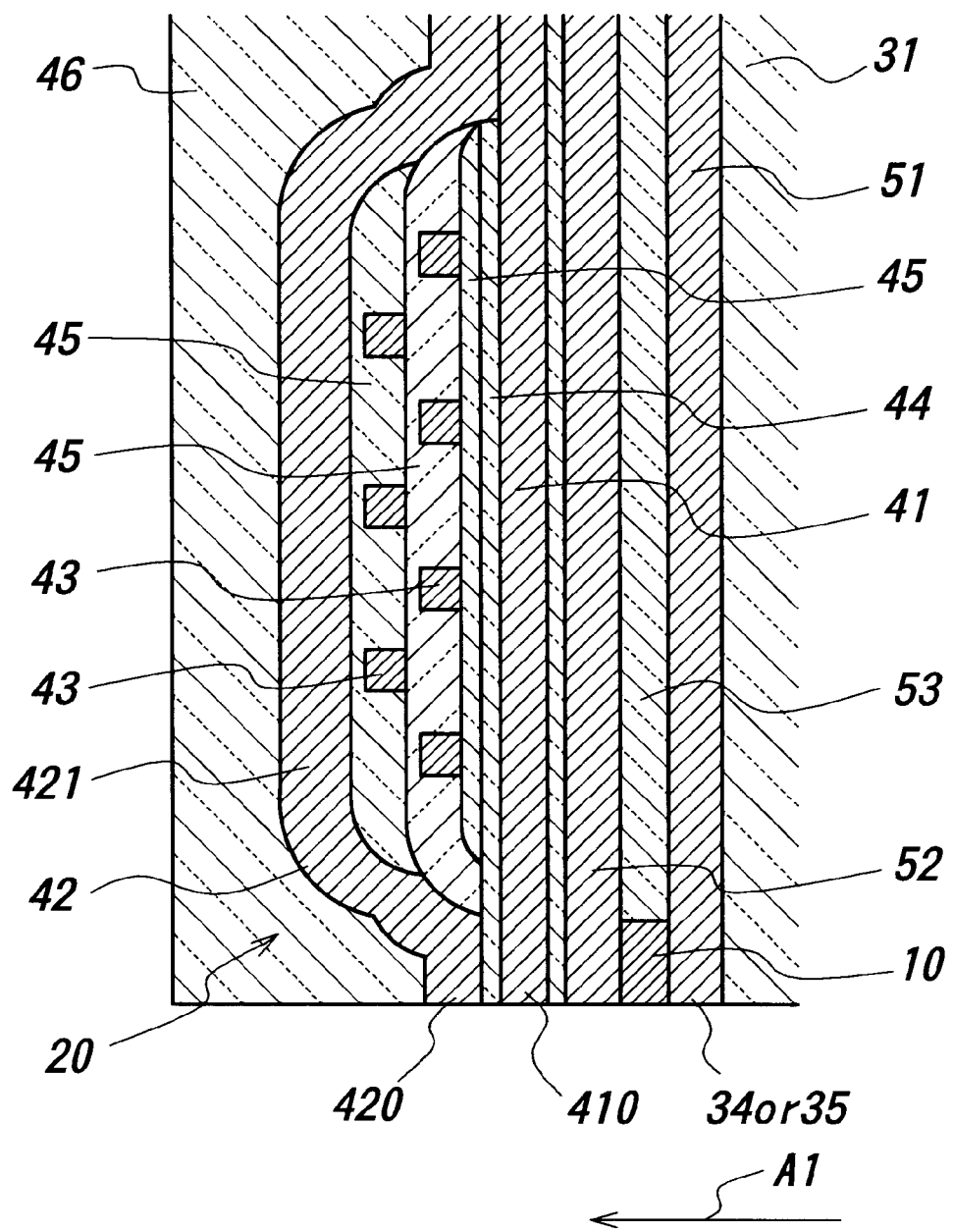
FIG. 6 is an enlarged cross sectional view showing a portion of the thin film magnetic head shown in FIG. 5.

FIG. 5 is a perspective view showing a longitudinal recording thin film magnetic head which includes the magnetoresistive effective type element 10 as a reading element and an inductive type electromagnetic conversion element as a writing element, and FIG. 6 is an enlarged cross sectional view showing a portion of the thin film magnetic head shown in FIG. 1. A longitudinal recording thin film magnetic head 30 depicted in FIGS. 5 and 6 includes a slider 31, the magnetoresistive effective type element 10 as a reading element, and an inductive type electromagnetic conversion element 20 as a writing element. In FIGS. 5 and 6, the sizes of some components are exaggerated, and different from the real ones.

The slider 31 has rails 32 and 33 on its opposing surface to a magnetic recording medium, and the surfaces of the rails 32 and 33 are employed as air bearing surfaces (hereinafter, often called as "ABS"s) 34 and 35. The slider 31 does not always have the two rails 11 and 12, and may have one to three rails. Moreover, the slider may have a flat surface having no rail. For improving its floating characteristic, the opposing surface of the slider may have various geometrical shapes. This invention can be applied for any types of slider.

The slider 31 may have a protective film on the rails which is made of DLC or the like and has a thickness of 8–10 nm. In this case, the surface of the protective film functions as the ABSs 34 and 35. The slider 31 is a ceramic structural body composed of a substrate made of $Al_2O_3$—TiC, etc. and an inorganic insulating film made of $Al_2O_3$, $SiO_2$ etc. on the substrate.

The magnetoresistive effective type element 10 and the inductive type electromagnetic conversion element 20 are provided in the trailing edge TR side of either or both of rails 32 and 33. Then, on the trailing edge are provided pullout electrodes 36 and 37 connected to the inductive type electromagnetic conversion element 20 and pull-out electrodes 38 and 39 connected to the magnetoresistive effective type element 10.

The inductive type electromagnetic conversion element 20 includes a first magnetic film 41 doubling as a second shielding film for the magnetoresistive effective type element 10, a second magnetic film 42, a coil film 43, a gap film 44 made of alumina or the like, an insulating film 45 and a protective film 46. The second shielding film for the magnetoresistive effective type element 10 may be made of another magnetic film.

The forefronts 410 and 420 of the first magnetic film 41 and the second magnetic film 42 are opposed each other via the thin gap film 44, and constitute a pole portion of the thin film magnetic head for writing. The first and second magnetic films 41 and 42 may be composed of a magnetic single layer or a magnetic multilayer for improving the performances of the pole portion. In view of narrowing the track width and developing the recording performance, various modification has been made for the pole portion structure. This invention can be applied for any pole portion structures. The gap film 54 is composed of a non-magnetic metallic film or an inorganic insulating film such as alumina.

The second magnetic film 42 is risen up at a given angle on the gap film 44 in the pole portion side. Also, the second magnetic film 42 is extended backward from the ABSs 34 and 35 with keeping a given inner gap for the first magnetic film 41, and joined with the first magnetic film 41 at a backside joining portion 49. As a result, a thin film magnetic circuit is completed with the first and the second magnetic films 41 and 42, and the gap film 44.

The coil film 43 is sandwiched with the first and second magnetic films 41 and 42, and whirled around the backside joining portion 49. Both ends of the coil film 43 are connected to the pull-out electrodes 35 and 37 (see, FIG. 5). The whirling number and the layer number of the coil film 43 are not restricted. The coil film 43 is embedded into an insulating film 45.

The inner gap between the first and the second magnetic films 41 and 42 are filled by the insulating film 45. The second magnetic film 42 is provided on the insulating film 45. The insulating film 45 may be composed of an organic insulating resin film or an inorganic insulating film such as an $Al_2O_3$ film or a $SiO_2$ film. If the insulating film 45 is made of an inorganic insulating film, the maximum protrusion volume of the film 45 can be reduced, compared with the film 45 being made of an organic insulating resin film because it has a smaller heat expansion.

Then, the inductive type electromagnetic conversion element 20 is covered with a protective film 46. Therefore, the inductive type electromagnetic conversion element 20 is protected by the protective film 46. The protective film 46 is made of an inorganic insulating material such as $Al_2O_3$ or $SiO_2$ entirely.

The magnetoresistive effective type element 10 is composed of a TMR element according to the present invention. The magnetoresistive effective type element 10 is embedded in an insulating film 53 between the first shielding film 51 and the second shielding film 52. The insulating film 53 is made of alumina or the like. The magnetoresistive effective type element 10 is connected to the pull-out electrodes 38 and 39 which are electrically connected to the first shielding film 51 and the second shielding film 52 (see, FIG. 5)

Figure 7:
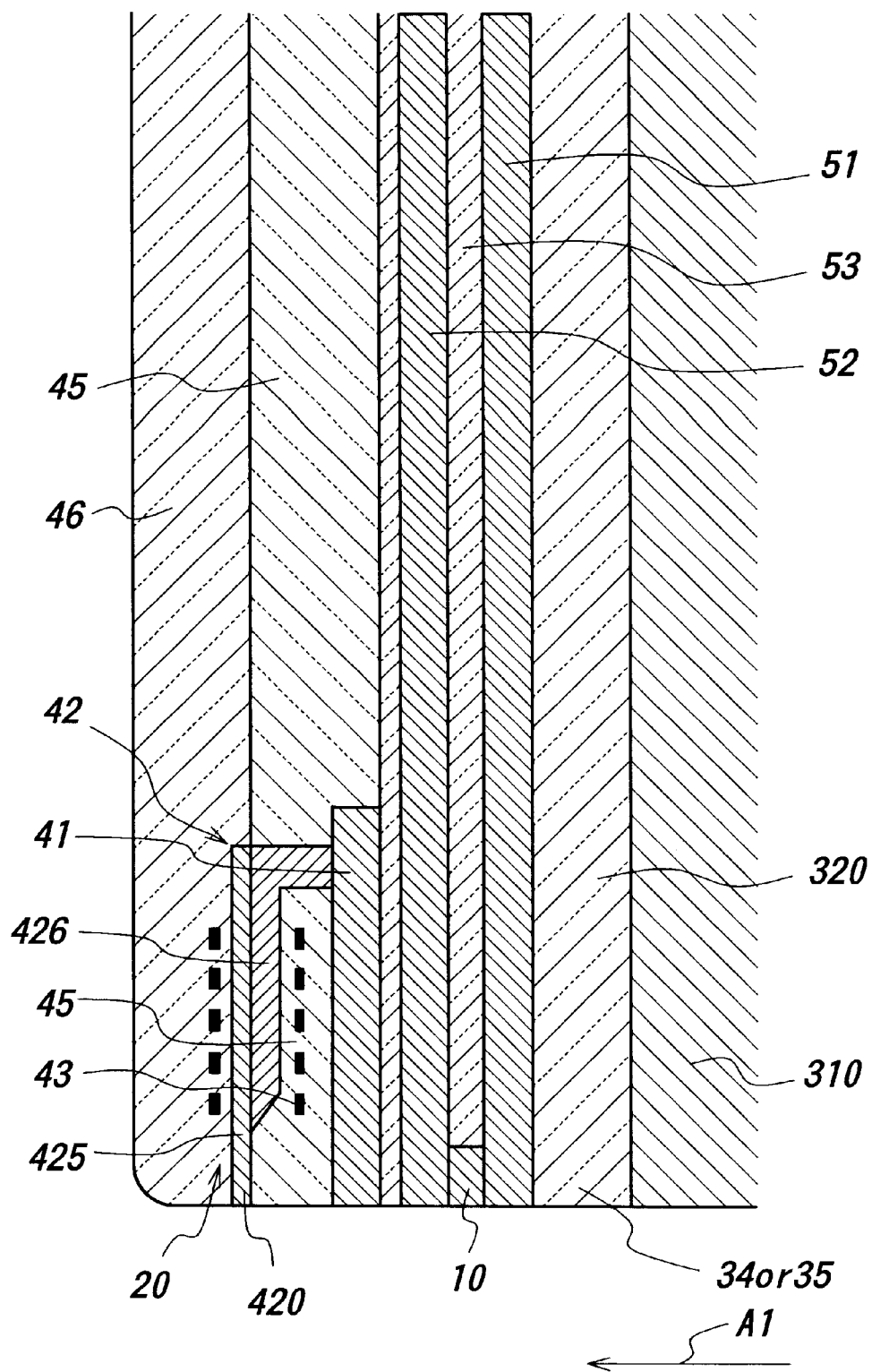
FIG. 7 is an enlarged cross sectional view showing a portion of a thin film magnetic head for perpendicular magnetic recording.

FIG. 7 is an enlarged cross sectional view showing a portion of a thin film magnetic head for perpendicular magnetic recording. In FIG. 7, the same numerals are given to the similar components to the ones shown in FIGS. 5 and 6. In a thin film magnetic head for perpendicular magnetic recording depicted in FIG. 7, the second magnetic film 42 includes a main magnetic pole 425 and an auxiliary magnetic pole 426. The main magnetic pole 425 functions as a pole portion for perpendicular writing, and the auxiliary magnetic pole connects the main magnetic pole 425 and the first magnetic film 41 magnetically. The magnetic flux return path from the main magnetic pole 425 is composed of the first magnetic film 41. The coil film 43 is whirled around the main magnetic pole 425 and the auxiliary magnetic pole 426.

Since the other components are similar to the ones shown in FIG. 6, the detail description is omitted. By the use of the thin film magnetic head for perpendicular magnetic recording, since the magnetic recording film of a magnetic recording medium is magnetized perpendicular to the main surface thereof, high density recording can be performed. Herein, the reference numeral "310" designates a substrate to constitute a slider, and the reference numeral "320" designates an inorganic insulating film which is provided on the substrate.

Figure 8:
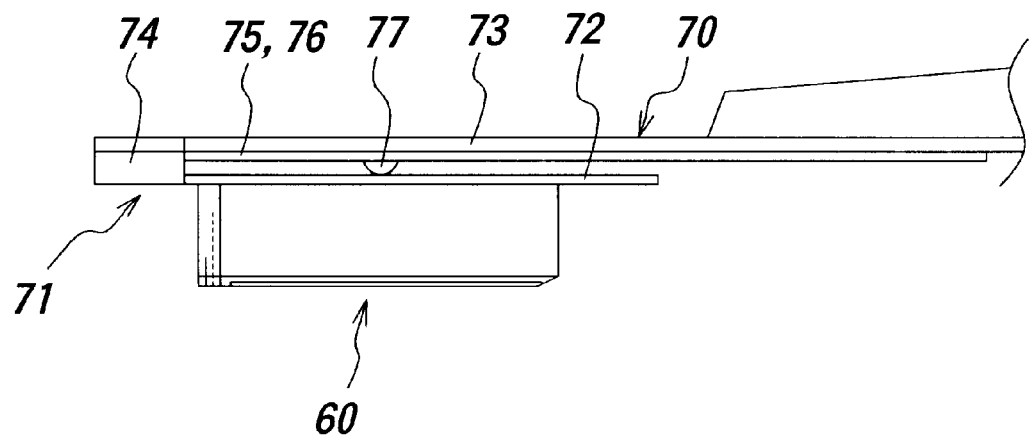
FIG. 8 is an elevational view showing a portion of a magnetic head device according to the present invention.
Figure 9:
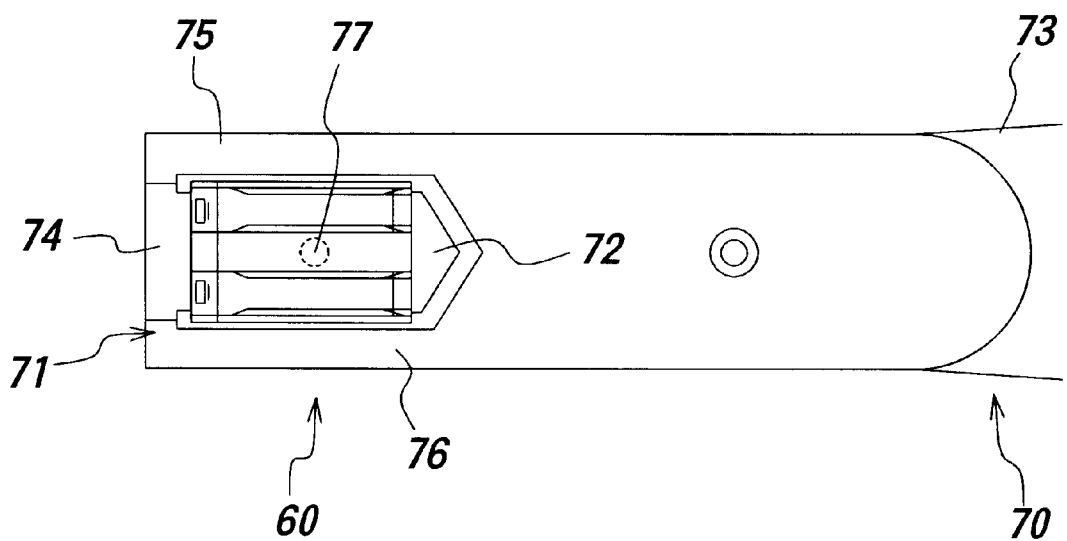
FIG. 9 is a bottom plan view of the magnetic head device shown in FIG. 8.

FIG. 8 is an elevational view showing a portion of a magnetic head device according to the present invention, and FIG. 9 is a bottom view of the magnetic head device shown in FIG. 8. A depicted magnetic head device includes a thin film magnetic head 60 and a head supporting device 70. The thin film magnetic head 60 is similar to the one shown in FIGS. 5–7.

The head supporting device 70 supports the thin film magnetic head 60 at the under surface of a flexible member 71 made of a metallic plate which is attached on the free edge thereof in the long direction of a supporting member 73 made of a metallic plate.

The flexible member 71 has two outer frames 75 and 76 extending along the long direction of the supporting member 73, a side frame 74 to joined the outer frames 75 and 76 at the edge thereof, and a tongue-shaped member 72, of which one end is a free edge, extending along the outer frames 75 and 76 from the center of the side frame.

On the center of the tongue shaped member 72 is positioned a hemispherical loading protrusion 77, bulging on the supporting member 73, to apply load to the tongue-shaped member 72 from the loading protrusion 77.

The thin film magnetic head 60 is attached on the under surface of the tongue-shaped member 72 so that it can have its air outflow edge along the side frame 74. In the present invention, the head supporting device is not limited to the above embodiment.

Figure 10:
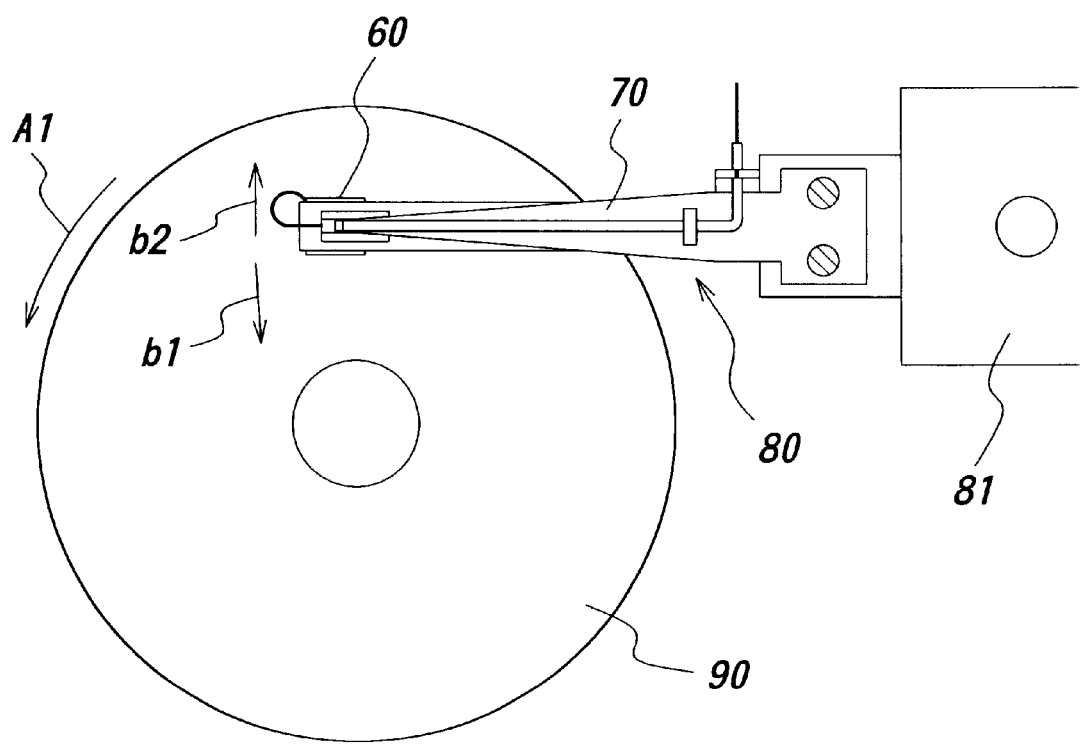
FIG. 10 is a plan view schematically showing a magnetic disk driving device according to the present invention.

FIG. 10 is a plan view of a magnetic disk drive device according to the present invention. A magnetic recording drive device depicted in FIG. 10 includes a magnetic head device 80 similar to the one shown in FIGS. 8 and 9 and a magnetic disk 7. The magnetic head device 80 is driven by a position determining device 81 which supports one end of the device 80. The thin film magnetic head 60 of the magnetic head device 80 is supported by the head supporting device 70 so that it can face the magnetic recording surface of the magnetic disk 90.

When the magnetic disk 90 is rotated in the Al direction by a driving device (not shown), the thin film magnetic head 60 is floated from on the magnetic disk 90 by a minute distance. The magnetic recording drive device shown in FIG. 10 is called as a "rotary-actuator driving system". In this case, the thin film magnetic head 60 which is attached to the forefront of the head supporting device 70 is driven in the radial direction b1 or b2 of the magnetic disk 90 and positioned on a given track by the position determining device 81. Then, magnetic recording operation and magnetic reading operation can be performed on the given track by the inductive type electromagnetic conversion element 20 and the magnetoresistive effective type element 10, respectively.

Although the present invention was described in detail with reference to the above examples, this invention is not limited to the above disclosure and every kind of variation and modification may be made without departing from the scope of the present invention.

As mentioned above, according to the magnetoresistive effective type element of the present invention, since the second top shielding film and the second bottom shielding film are provided outside the first top shielding film and the first bottom shielding film, respectively, noise on the element can be reduced entirely, and the reading width can be narrowed. Therefore, a give information stored in a magnetic recoding medium in high density can be read out at high S/N ratio.

What is claimed is:

1. A magnetoresistive effective type element, comprising:
   a magnetoresistive effective film;
   a first shielding film of which one main surface is adjacent to one main surface of said magnetoresistive effective film;

a second shielding film of which one main surface is adjacent to the other main surface of said magnetoresistive effective film; and a third shielding film of which one main surface is adjacent to the other main surface of said first shielding film or said second shielding film opposite to said magnetoresistive effective film, wherein said first shielding film and said second shielding film function as current-supplying layers to flow current perpendicular to and through said magnetoresistive effective film, and wherein said first shielding film and said second shielding film are made of at least one selected from the group consisting of NiFe, CoZrTa, FeN, FeAlSi, NiFe alloy, Co-based amorphous material and Fe-based soft magnetic material.

2. The magnetoresistive effective type element as defined in claim 1, wherein thickness of said third shielding film is set within 1000–3000 nm.

3. The magnetoresistive effective type element as defined in claim 2, wherein the thickness of said first shielding film is set to 500 nm or below, and the thickness of said second shielding film is set to 500 nm or below.

4. The magnetoresistive effective type element as defined in claim 1, further comprising a fourth shielding film of which one main surface is adjacent to the other main surface of said first shielding film or said second shielding film, which is not adjacent to said third shielding film, opposite to said magnetoresistive effective film, wherein thickness of said fourth shielding film is set within 1000–3000 nm.

5. The magnetoresistive effective type element as defined in claim 4, wherein the thickness of said first shielding film is set to 500 nm or below, and the thickness of said second shielding film is set to 500 nm or below.

6. The magnetoresistive effective type element as defined in claim 1, further comprising conductive films which are made of at least one selected from the group consisting of Ti, Cr, Rh, Al, Ta, Au, Ag, Cu and alloy thereof and connected continuously to said first shielding film and said second shielding film at the opposite sides of said first shielding film and said second shielding film to the end surfaces thereof exposed to the air bearing surface of said magnetoresistive effective type element.

7. The magnetoresistive effective type element as defined in claim 1, wherein said third shielding film is made of at least one selected from the group consisting of NiFe, CoZrTa, FeN, FeAlSi, NiFe alloy, Co-based amorphous material and Fe-based soft magnetic material.

8. The magnetoresistive effective type element as defined in claim 1, further comprising a fourth shielding film of which one main surface is adjacent to the other main surface of said first shielding film or said second shielding film, which is not adjacent to said third shielding film, opposite to said magnetoresistive effective film, wherein said fourth shielding film is made of at least one selected from the group consisting of NiFe, CoZrTa, FeN, FeAlSi, NiFe alloy, Co-based amorphous material and Fe-based soft magnetic material.

9. The magnetoresistive effective type element as defined in claim 1, wherein the main surfaces of said third shielding film are set larger than the main surfaces of said first shielding film and said second shielding film, and said third shielding film is projected from the peripheries of said first shielding film and said second shielding film so as to cover said first shielding film and said second shielding film.

10. The magnetoresistive effective type element as defined in claim 1, wherein said magnetoresistive effective film includes a ferromagnetic tunnel film structure.

11. The magnetoresistive effective type element as defined in claim 1, wherein said magnetoresistive effective film includes a spin-valve film structure.

12. The thin film magnetic head, comprising a magnetoresistive effective type element as defined in claim 1 as a reading element.

13. The thin film magnetic head as defined in claim 12, further comprising a writing element.

14. The thin film magnetic head as defined in claim 13, wherein the writing element is composed of an inductive type electromagnetic conversion element which comprises a first magnetic film, a second magnetic film and a gap film, and the forefronts of said first magnetic film and said second magnetic film are separated by said gap film, to constitute a writing pole portion.

15. The thin film magnetic head as defined in claim 13, wherein the writing element is composed of an inductive type electromagnetic conversion element which comprises a first magnetic film and a second magnetic film, and said second magnetic film comprises a main magnetic pole to constitute a perpendicular writing pole portion and an auxiliary magnetic pole to magnetically join said main magnetic pole and said first magnetic film.

16. The magnetic head device, comprising a thin film magnetic head as defined in claim 12 and a head-supporting device to support said thin film magnetic head.

17. The magnetic disk driving device, comprising a magnetic head device as defined in claim 16 and a magnetic disk to be magnetically recorded and reproduced by said magnetic head device.

18. A magnetoresistive effective type element, comprising:

a magnetoresistive effective film;

a first shielding film of which one main surface is adjacent to one main surface of said magnetoresistive effective film;

a second shielding film of which one main surface is adjacent to the other main surface of said magnetoresistive effective film; and a third shielding film of which one main surface is adjacent to the other main surface of said first shielding film or said second shielding film opposite to said magnetoresistive effective film, wherein said first shielding film and said second shielding film function as current-supplying layers to flow current perpendicular to and through said magnetoresistive effective film, and wherein said first shielding film and said second shielding film are composed of a stacking structure of a soft magnetic layer made of at least one selected from the group consisting of NiFe, CoZrTa, FeN, FeAlSi, NiFe alloy, Co-based amorphous material and Fe-based soft magnetic material and a conductive layer made of non-magnetic metal or non-magnetic metal alloy.

19. The magnetoresistive effective type element as defined in claim 18, wherein said non-magnetic metal is at least one selected from the group consisting of Ti, Cr, Ta, Rh, Al, Au, Ag and Cu.

20. The magnetoresistive effective type element as defined in claim 18, wherein thickness of said third shielding film is set within 1000–3000 nm.

21. The magnetoresistive effective type element as defined in claim 20, wherein the thickness of said first shielding film is set to 500 nm or below, and the thickness of said second shielding film is set to 500 nm or below.

22. The magnetoresistive effective type element as defined in claim 18, further comprising conductive films which are made of at least one selected from the group consisting of Ti, Cr, Rh, Al, Ta, Au, Ag, Cu and alloy thereof and connected continuously to said first shielding film and said second shielding film at the opposite sides of said first shielding film and said second shielding film to the end surfaces thereof exposed to the air bearing surface of said magnetoresistive effective type element.

23. The magnetoresistive effective type element as defined in claim 18, wherein said third shielding film is made of at least one selected from the group consisting of NiFe, CoZrTa, FeN, FeAlSi, NiFe alloy, Co-based amorphous material and Fe-based soft magnetic material.

24. The magnetoresistive effective type element as defined in claim 18, further comprising a fourth shielding film of which one main surface is adjacent to the other main surface of said first shielding film or said second shielding film, which is not adjacent to said third shielding film, opposite to said magnetoresistive effective film, wherein said fourth shielding film is made of at least one selected from the group consisting of NiFe, CoZrTa, FeN, FeAlSi, NiFe alloy, Co-based amorphous material and Fe-based soft magnetic material.

25. The magnetoresistive effective type element as defined in claim 18, wherein the main surfaces of said third shielding film are set larger than the main surfaces of said first shielding film and said second shielding film, and said third shielding film is projected from the peripheries of said first shielding film and said second shielding film so as to cover said first shielding film and said second shielding film.

26. The magnetoresistive effective type element as defined in claim 18, further comprising a fourth shielding film of which one main surface is adjacent to the other main surface of said first shielding film or said second shielding film, which is not adjacent to said third shielding film, opposite to said magnetoresistive effective film, wherein thickness of said fourth shielding film is set within 1000–3000 nm.

27. The magnetoresistive effective type element as defined in claim 26, wherein the thickness of said first shielding film is set to 500 nm or below, and the thickness of said second shielding film is set to 500 nm or below.

28. The magnetoresistive effective type element as defined in claim 18, wherein said magnetoresistive effective film includes a ferromagnetic tunnel film structure.

29. The magnetoresistive effective type element as defined in claim 18, wherein said magnetoresistive effective film includes a spin-valve film structure.

30. The thin film magnetic head comprising a magnetoresistive effective type element as defined in claim 18 as a reading element.

31. The thin film magnetic head as defined in claim 30, further comprising a writing element.

32. The thin film magnetic head as defined in claim 31, wherein the writing element is composed of an inductive type electromagnetic conversion element which comprises a first magnetic film, a second magnetic film and a gap film, and the forefronts of said first magnetic film and said second magnetic film are separated by said gap film, to constitute a writing pole portion.

33. The thin film magnetic head as defined in claim 31, wherein the writing element is composed of an inductive type electromagnetic conversion element which comprises a first magnetic film and a second magnetic film, and said second magnetic film comprises a main magnetic pole to constitute a perpendicular writing pole portion and an auxiliary magnetic pole to magnetically join said main magnetic pole and said first magnetic film.

34. The magnetic head device, comprising a thin film magnetic head as defined claim 30 and a head-supporting device to support said thin film magnetic head.

35. The magnetic disk driving device, comprising a magnetic head device as defined in claim 34 and a magnetic disk to be magnetically recorded and reproduced by said magnetic head device.

* * * * *